United States Patent [19]

Hoshino et al.

[11] Patent Number: 5,438,582
[45] Date of Patent: Aug. 1, 1995

[54] LASER POWER MONITOR CIRCUIT USED IN A MAGNETO-OPTICAL DISK DEVICE

[75] Inventors: Shunji Hoshino, Yokohama; Naoto Inaba, Hiratuka, both of Japan

[73] Assignee: Nikon Corporation, Tokyo, Japan

[21] Appl. No.: 337,378

[22] Filed: Nov. 8, 1994

[30] Foreign Application Priority Data

Nov. 8, 1993 [JP] Japan .................. 5-278393

[51] Int. Cl.⁶ .............................................. H01S 3/00
[52] U.S. Cl. ........................................................ 372/38
[58] Field of Search ............................ 372/38; 369/58

[56] References Cited

U.S. PATENT DOCUMENTS

| | | | |
|---|---|---|---|
| 4,745,610 | 5/1988 | Yoshikawa | 372/38 |
| 4,855,988 | 8/1995 | Shinbayashi et al. | 372/38 |
| 4,924,473 | 5/1990 | Burgyan et al. | 372/38 |
| 5,018,154 | 5/1991 | Ohashi | 372/38 |
| 5,341,359 | 8/1994 | Birukawa et al. | 369/58 |
| 5,345,434 | 9/1994 | Ide et al. | 369/58 |

Primary Examiner—Léon Scott, Jr.

[57] ABSTRACT

A laser power monitor circuit for monitoring the power of a laser used in a magneto-optical disk device and other related devices. In order to provide marks in the recording medium, a write power of the laser is required, and in between the marks, the laser is to have a pedestal power. During recording on the magneto-optical disk, recording corrections are performed at the start of the pedestal power and write power of the laser to provide marks in the recording medium which are properly shaped. The laser power monitor circuit accurately monitors the power of the laser light on a recording medium and includes a reverse correction circuit to provide reverse correction of the recording corrected values among the monitored values of laser power to bring the laser to the appropriate write power or pedestal power.

12 Claims, 8 Drawing Sheets

LASER POWER MONITOR CIRCUIT USED IN A MAGNETO-OPTICAL DISK DEVICE

BACKGROUND OF THE INVENTION

1. Field of the Invention

The present invention relates to a laser power monitor circuit to monitor the power of a laser used in a magneto-optical disk device and other related devices.

2. Description of the Related Art

The thermal properties of a laser beam are generally used in the field of magneto-optical recording. The recording and playback of a magneto-optical disk are performed using a light (laser) beam emitted from a laser. The light beam has a diameter of about 1 μm, and is irradiated on the vertical magnetization film surface (recording surface) of the magneto-optical disk.

Recording on the magneto-optical disk is performed by a method known as Curie point writing. Laser light, intensity modulated according to the information to be recorded, is irradiated onto the magneto-optical disk. A spot of light is formed on the portion of the magneto-optical disk surface onto which the laser light is irradiated. Then, when the temperature of the recording film of the magneto-optical disk exceeds (becomes high) the Curie point (a temperature fixed for the material used in the magneto-optical disk), this portion of the recording film becomes nonmagnetic. During the heating by laser light, an external magnetic field is impressed on the magneto-optical disk. When the portion which the light spot has irradiated moves from the position of the light spot as the magneto-optical disk rotates, the temperature of this portion of the recording film falls. At the point in time at which the temperature of the recording film falls below the Curie point temperature, the recording film is magnetized in the direction of the impressed external magnetic field. In this manner, recording is performed by changing the direction of magnetization.

In the optical recording medium of optical disks and magneto-optical disks and the like, tracks used to record information are formed in a vortex form or as concentric circles. One or many of these tracks are formed per revolution. Two kinds of information units, corresponding to 0 and 1, are formed on these tracks and information is recorded.

Generally, the magnetization of the tracks of a magneto-optical disk is made uniform in one direction (for example, upwards) by impressing a strong external magnetic field before recording. After this, marks having the reverse direction of magnetization (for example, downwards) are formed on the tracks. Information is represented by these marks, for example, by their presence or absence, position of the front end (front edge) of the mark, position of the rear end (rear edge) of the mark, length of the mark, etc. In particular, the method in which the position of the edges of the mark represents information is called mark length recording. In the past, these marks were called pits or bits, but have recently been referred to as marks.

Such marks are formed using heat, as mentioned above. Changes in the laser power at this time become as shown in FIG. 14. The level of the laser power when a mark is formed is the write power, Pw, and the level of the laser power when a mark is not being formed is the pedestal power, Pped.

However, a mark is not formed if the temperature of the recording layer fails to exceed the Curie point. That is, even if the power level of the laser is the write power, if the temperature of the recording film does not become higher than the Curie point, a mark is not formed. Because of this, since the temperature of the recording film does not immediately reach the Curie point in the front edge portion of the mark, the mark is slow to form. The shape of the front edge portion of the mark becomes narrow and short. Moreover, on the other hand, in the rear edge portion of the mark, because the temperature of the recording film does not immediately fall below the Curie point, the shape of the mark does not immediately end. Therefore, the shape of the mark in the rear edge portion becomes thick and long. Because of this, the mark cannot be formed in the appropriate shape.

Consequently, by causing the laser power to change as in FIG. 15, a recording correction is performed by edge intensity adjustment. In the portion to form the front edge of the mark, the laser power is made higher than the write power, and in the portion to form the rear edge of the mark, the power is made lower than the pedestal power. A mark of appropriate shape is made by proceeding in this manner. At this time, the amount of laser power at the time of intensity adjustment of the front edge of the mark (the power of light generated which is greater than the write power) is called an overshoot amount, and the amount of laser power at the time of intensity adjustment of the rear edge of the mark (the power of light generated which is smaller than the pedestal power) is called the undershoot amount. The overshoot amount and undershoot amount are collectively termed "recording correction amounts". These recording correction amounts are fixed as the edge intensity adjustment amounts I1 and I2, respectively, and have a time constant τ.

Moreover, when recording data, the laser power level is controlled, and the laser power is monitored so that recording is performed at the appropriate laser power. Nevertheless, even when controlling the laser power level by monitoring the laser power as mentioned above, when the monitoring of laser power is performed at the time of performing a recording correction, there are problems in accurately controlling the power of the laser light. The following occurs as a result.

When monitoring the power of the laser at the time of performing the recording correction of a portion of the front edge of a mark (namely, before reducing the laser power down to the write level), because the laser power is higher than the write level, the result of performing the control is that the write power level of the laser becomes lower than the write power Pw. Similarly, when monitoring the laser power at the time of performing recording correction of a portion of the rear end of a mark, the end result is higher than the pedestal power Pped.

SUMMARY OF THE INVENTION

The present invention takes into account the above-noted problems, and accordingly, it is an object of the present invention to provide a laser power monitor circuit which accurately monitors the power of a laser used in a magneto-optical disk device.

Additional objects and advantages of the invention will be set forth in part in the description which follows and, in part, will be obvious from the description, or may be learned by practice of the invention.

The present inventors initially considered a laser power monitor circuit to accurately control timing of the monitoring function. However, the present inventors became aware that, in this type of laser power monitor circuit, the apparatus to accurately control timing of the monitoring was complicated and, as a result, the circuit be, came costly.

Consequently, the present inventors, in the course of their diligent research, discovered that accurate monitoring of the power of laser light is possible by arranging, in a laser power monitor circuit, a reverse correction circuit for the negation of the recording corrected values among the monitor values of laser power.

Namely, the laser power monitor circuit according to a first aspect of the present invention comprises:
- a monitor unit to monitor the power of the light and, as a result, generating a monitor signal;
- a setting circuit to set the power of the light at distinct predetermined levels;
- a correction circuit to correct and adjust the power of the light relative to the distinct predetermined levels; and
- a reverse correction circuit to reverse correct the correction made by the correction circuit based upon the monitor signal.

It is preferable that the frequency characteristic of the reverse correction circuit is about equal to the frequency characteristic of the aforementioned correction circuit.

Further, the laser power monitor circuit according; to a second aspect of the present invention comprises:
- a photoelectric conversion unit to convert the power of the laser into an electrical signal proportional to the power;
- a setting circuit to set the power of the light at distinct predetermined levels;
- a correction circuit to correct and adjust the power of the light relative to the distinct predetermined levels; and
- a reverse correction circuit to reverse correct the correction made by the correction circuit based upon the electrical signal output by said photoelectric conversion unit.

Preferably, the frequency characteristic of the aforementioned reverse correction circuit is about equal to the frequency characteristic of the aforementioned correction circuit.

Further, the laser power monitor circuit according to a third aspect of the present invention comprises:
- a laser drive circuit to drive the laser to produce a write power level which forms the mark and a pedestal power level which does not form the mark, and to drive the laser to produce an overshoot correction of the write power level at a front edge of the mark and an undershoot correction of the pedestal power level at a back edge of the mark;
- a laser control circuit, connected to said laser drive circuit, to control said laser drive circuit; and
- a laser monitor circuit, connected to the laser control circuit, to monitor the power of the laser and to provide a reverse overshoot correction of the write power and reverse undershoot correction of the pedestal power through said laser control and laser drive circuits.

BRIEF DESCRIPTION OF THE DRAWINGS

The objects and advantages of the invention will become apparent and more readily appreciated from the following description of the preferred embodiments, taken in conjunction with the accompanying drawings of which.

DESCRIPTION OF THE PREFERRED EMBODIMENTS

Figure 1:
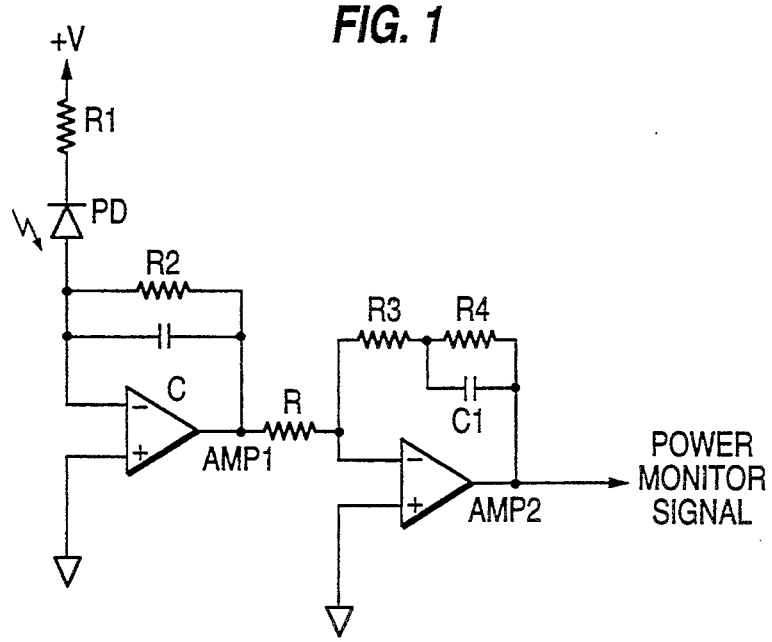
FIG. 1 is a circuit diagram showing a laser power monitor circuit according to a first embodiment the present invention.

Reference will now be made in detail to the present preferred embodiments of the present invention, examples of which are illustrated in the accompanying drawings, wherein like reference numerals refer to like elements throughout.

A laser used in a magneto-optical disk device is controlled to output power corresponding to two levels, the write power and the pedestal power. At this time, in order to reliably form marks on the magneto-optical disk, corrections are made for the laser output. In this manner, the laser power is controlled to two kinds of power levels, and these power levels are corrected and output by a laser drive circuit. A laser power monitor circuit is used in order to monitor the output laser power. This monitoring of laser power is performed in order to inspect whether or not the write power and the pedestal power have assumed the predetermined values. Accordingly, the detection of the changes of the power levels of the corrected portions creates the occasion of causing differences to arise in the control of the power levels. Consequently, a reverse correction is performed which corresponds to the correction amount. A laser power monitor circuit equipped with a reverse correction circuit in order to perform this reverse correction is specifically shown in FIG. 1. Moreover, the laser power monitor circuit inspects whether or not the laser power has become the predetermined write power or pedestal power, and the differences with respect to the predetermined values as the write power control voltage (maximum value control voltage) and pedestal power control voltage (minimum value control voltage) are fed back to the laser drive circuit. This feedback, which are the inspected differences determined by the laser power monitor circuit, is performed by a laser power control circuit.

FIG. 1 is a circuit diagram of a first embodiment of a laser power monitor circuit of the present invention. The laser is driven by a laser drive circuit shown in FIG. 3 and this laser drive circuit can bring about the generation of laser light at a power as shown in FIG. 4.

The front edge of a mark at the time of recording correction, and the degree of emphasis of the rear edge, are represented by the following equation.

(edge degree of emphasis)=$R32/R31$, time constant $\tau L/R32$.

The edge degree of emphasis is fixed by $R32/R31$, and the time constant $\tau$ is $L/R32$. Moreover, the edge emphasis amount I is represented by the following equation.

$I = R32 (Pw - Pped)/R31$.

That is, the recording correction value is decided by changing the write power and the pedestal power. This control of the write power is performed by a maximum value control voltage, whereas the control of the pedestal power is performed by a minimum value control voltage.

In the case of forming a mark on the recording medium, setting of the laser power level at the write power is performed, with a maximum value control voltage as the predetermined voltage value. Between the marks, setting of the laser power level to the pedestal power is performed, with a minimum value control voltage as the predetermined voltage. The timing of the laser light generation during the formation of a mark is performed by respective outputs of recording signals whose polarity mutually invert, and respective differential transistors. The semiconductor laser (LD) is driven, with appropriate drive currents and timing, at the set write power or pedestal power.

The operation of the laser drive circuit will be described next. The laser drive circuit, because the signal polarities of the inverted recording signal and recording signal are mutually inverted (namely, when one signal is at a high level, the other is at a low level), has two kinds of operation.

Moreover, the input signal may be a two-valued signal, and it may not be the case that, as in the present embodiment, the polarities are mutually inverted.

Firstly, when the inverted recording signal is a low level signal, TR31 is OFF, and because at this time the recording signal is a high level signal, TR32 becomes ON. Because of this, current flows in TR32. The value of this current is set by the voltage of the maximum value control voltage. The voltage of the maximum value, control voltage is converted into a current by the voltage to current conversion circuit 11. The constant current source 12 is controlled by this current. The current which flows on the TR32 side is controlled by the current flowing in the constant current source 12. The current flowing at this time between point "a" and point "c" is I'. Because R32 and L are connected in parallel, "a" and "b" are shorted when there is a stationary state. That is, there is a voltage drop of I'×R31 between "a" and "c". Moreover, there is also a voltage drop between the bases and emitters of TR33 and TR34. In this manner, by setting the potential at point "d", the current flowing in LD is set. LD outputs light in proportion to the magnitude of this current. The maximum current flowing in LD is controlled by the constant current source 14. When there is not a stationary state, that is, when L is open and has gone from OFF to ON, there is a voltage drop of I'×(R31 +R32) between "a" and "c". Thus, there is a greater voltage drop between points "a" and "c" than when stationary, and the potential of point "c" is lower than when stationary. Because of this, the light generation power of LD can be greater than in the stationary state. Then, the circuit returns to the stationary state light output power, with a fixed time constant L/R2.

In the above manner, when the light generation power level of the laser goes from the pedestal power to the write power, the LD initially goes to a greater light generation power level than the stationary state (write power), and can afterwards go to a light generation power level smaller than this light generation power level.

Next, when a high level signal has been input into the inverted recording signal, TR31 becomes ON. Because the recording signal is a low level signal, TR32 becomes OFF. In a stationary state, because TR32 is OFF, no current flows between points "a" and "c", and the potential of the base of TR33 becomes the value of the minimum value control voltage. Moreover, there is a voltage drop between the bases and emitters of TR33 and TR34. The potential at point "d" is set in this manner, and the current flowing in LD is set. LD generates light in proportion to the magnitude of this current. The maximum current flowing in LD is controlled by the constant current source 14. When there is not a stationary state, that is, when the TR31 goes from OFF to ON, and TR32 goes from ON to OFF, there is a voltage drop of I'×(R31 +R32) between "a" and "c". Because the potential at the base of TR33 becomes a high potential in comparison with the potential when there is a stationary state, the light generation power of LD can be made small. Then, the potential at the base of TR33 approaches the potential of the stationary state of the pedestal power. At this time, the time constant is L/R2. In this manner, when the power level of the laser goes from the write level to the pedestal level, after the light generation power level has been made smaller than the pedestal power, it can go to light generation greater than this light generation power level.

Figure 2:
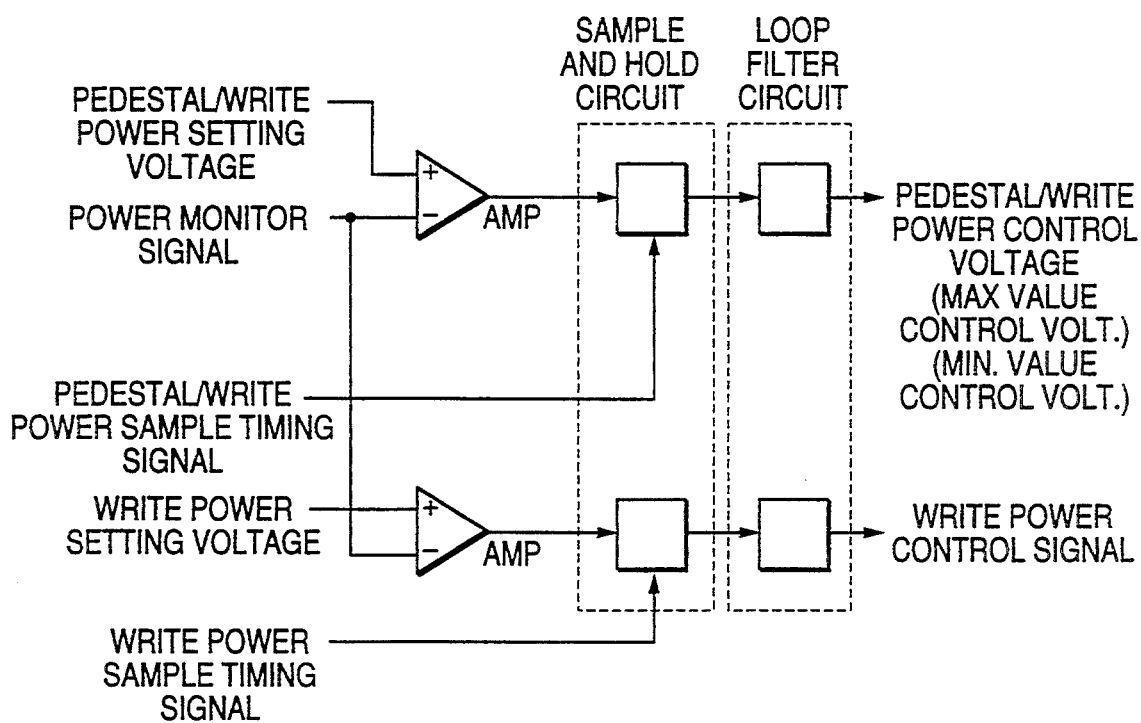
FIG. 2 is a circuit diagram showing a laser power control circuit according to the first embodiment of the present invention.

The operation of the laser power control circuit shown in FIG. 2 will be described next. In FIG. 2, in order to control the write power at a set value, the following operations are performed. The difference is detected of the power monitor signal voltage from the laser power monitor circuit of FIG. 1 to detect the power level when the laser is generating light, and the write power setting voltage. The value of this difference is sampled and held by a sample and hold circuit using a predetermined write power sample timing signal. The held difference voltage value, via a loop filter circuit, is output as a write power control voltage (maximum value control voltage) to the laser drive circuit (the circuit shown in FIG. 3). In addition to this, closed loop control is performed, and the write power setting voltage, or the light amount of the write power, is adjusted to a predetermined value.

Because the pedestal power is controlled to a set value, as a way to detect the power level when the laser is generating light, the difference between the power monitor signal voltage from the laser power monitor circuit, and the pedestal set voltage, is detected. The value of this difference is sampled and held, at a predetermined pedestal power sample timing signal, in the sample and hold circuit. The held difference voltage value is output, via a loop filter circuit, to the laser drive circuit (the circuit shown in FIG. 3) as a pedestal power control voltage (minimum value control voltage). In addition to this, closed loop control is performed, and the pedestal power setting voltage or the light amount of the pedestal power is adjusted to a predetermined value.

Figure 5:
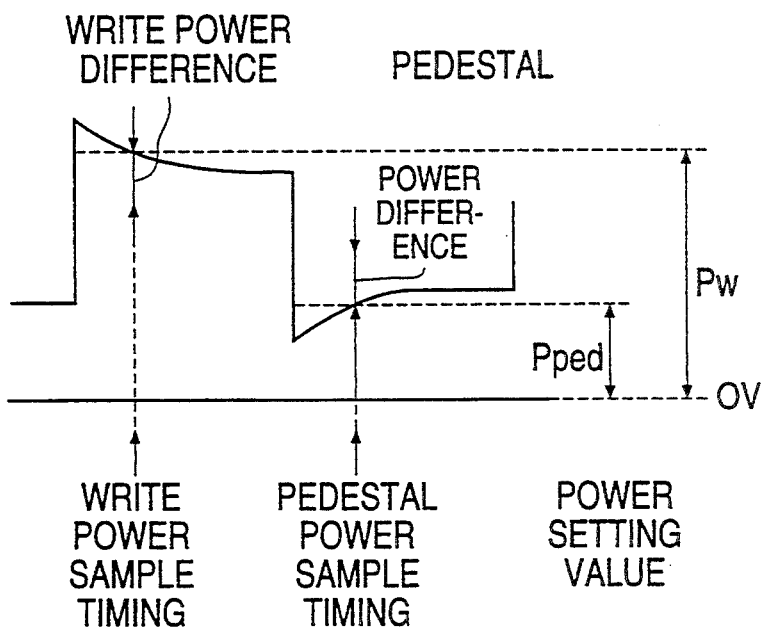
FIG. 5 is a diagram showing the light generation waveform of a laser when laser power control is performed at the time of recording correction without the laser monitor circuit of FIG. 1.

In the case that difference detection is performed at the predetermined timing by the laser power control circuit, the waveform of laser light generation at the time of recording correction becomes as shown in FIG. 5. The write power, which generates an amount of light, in comparison with the set value Pw, is smaller by the exact amount of the recording correction amount. The pedestal power, which generates a second amount of light, in comparison with the set value Pped, is larger by the exact amount of the recording correction amount. As a result, the correct setting of the overshoot and undershoot amounts of the respective front and rear edges of the mark is not performed, and thus the recording correction amount cannot be correctly set.

Figure 6:
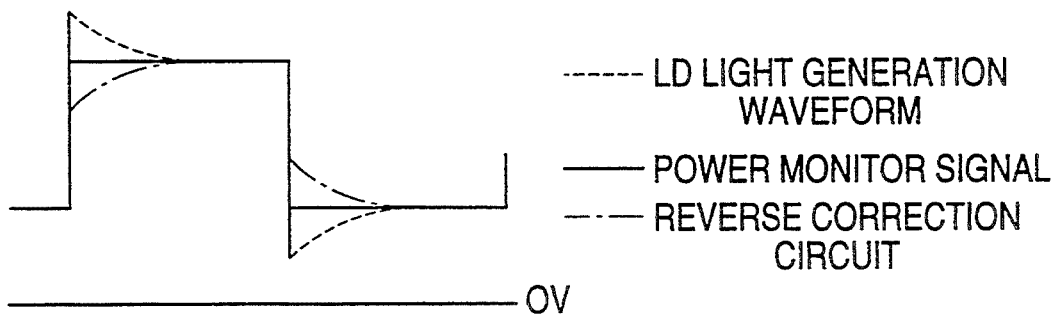
FIG. 6 is a waveform diagram showing laser power through the laser power monitor circuit according to the first embodiment of the present invention.

Consequently, the laser power monitor circuit shown in FIG. 1 is used. As shown in FIG. 6, the reverse corrected laser power can be monitored by the use of this kind of laser power monitor circuit. The laser power monitor circuit, with a circuit added to perform the reverse correction corresponding to the respective amounts of overshoot and undershoot of the front edge and rear edge of the mark at the time of recording correction, will be described. In FIG. 6, the portions represented by broken lines show the light generation waveform of the laser at the time of recording correction. When the voltage waveform is input into the laser power monitor circuit with an added reverse correction circuit, in the waveform of the broken lines, the characteristic represented by the single-dot chain line is added. The resulting output waveform becomes the waveform represented by the full line in FIG. 6.

FIG. 1 is a circuit diagram of the power monitor circuit with the reverse correction circuit as described in the preceding paragraph. In FIG. 1, when laser light is input to a PIN photodiode PD, a current proportional to the amount of this light is generated by the PIN photodiode PD, and current to voltage conversion is performed in AMP1. The output voltage from AMP1 is input to the reverse correction circuit which includes AMP2. It is then output, corrected to the voltage waveform shown by the full lines in FIG. 6, as a power monitor signal.

Figure 3:
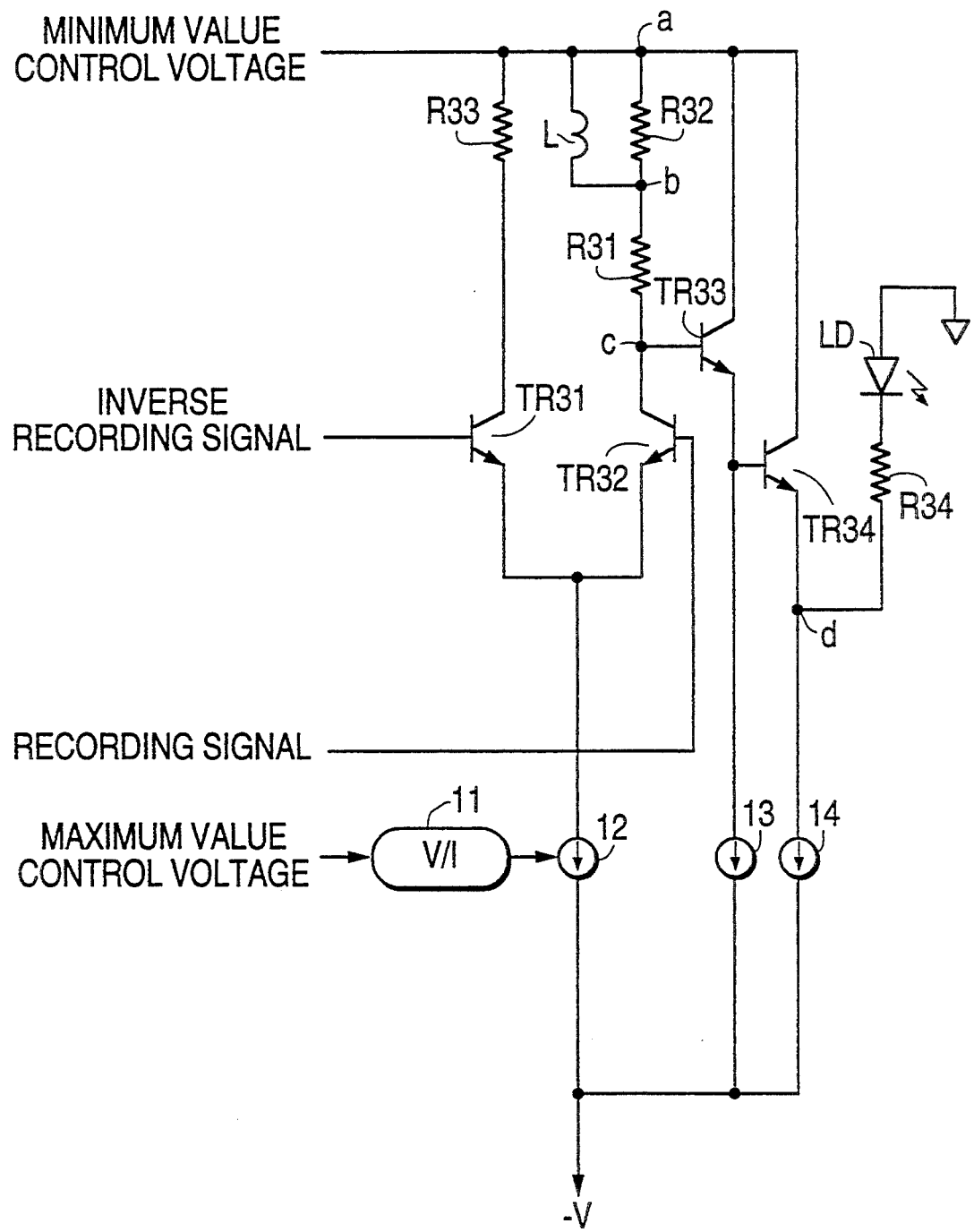
FIG. 3 is a circuit diagram showing a laser drive circuit according to the first embodiment of the present invention.
Figure 4:
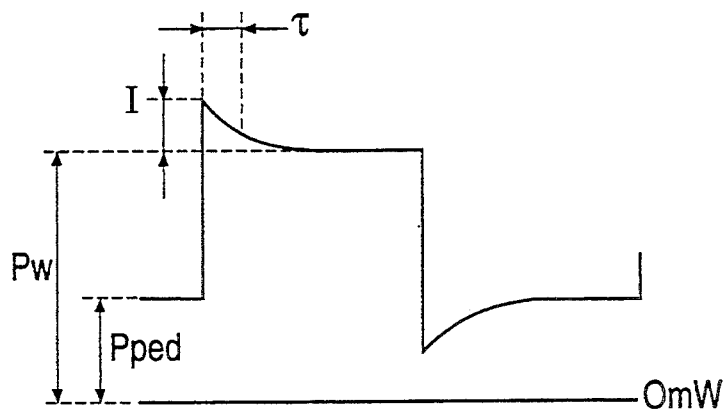
FIG. 4 is a diagram showing the light generation waveform of a laser using the laser drive circuit shown in FIG. 3 without the laser power monitor circuit of FIG. 1.

Here the frequency characteristics of the recording correction circuit shown in FIG. 3 are given by the following equations.

$$f1a = (R31 \times R32)/(R31 + R32)/L,$$

$$f2a = R32/L.$$

The frequency characteristics of the reverse recording correction circuit of FIG. 1 are given by the following equations.

$$f1b = 1/R4 \times C1,$$

$$f2b = (R3 + R4)/(R3 \times R4) \times C1.$$

The constants of the above equations are set such that the frequency characteristic of the reverse correction circuit and the frequency characteristic of the recording correction circuit are approximately equal (namely, such that f1a=f1b and also f2a=f2b).

Figure 7:
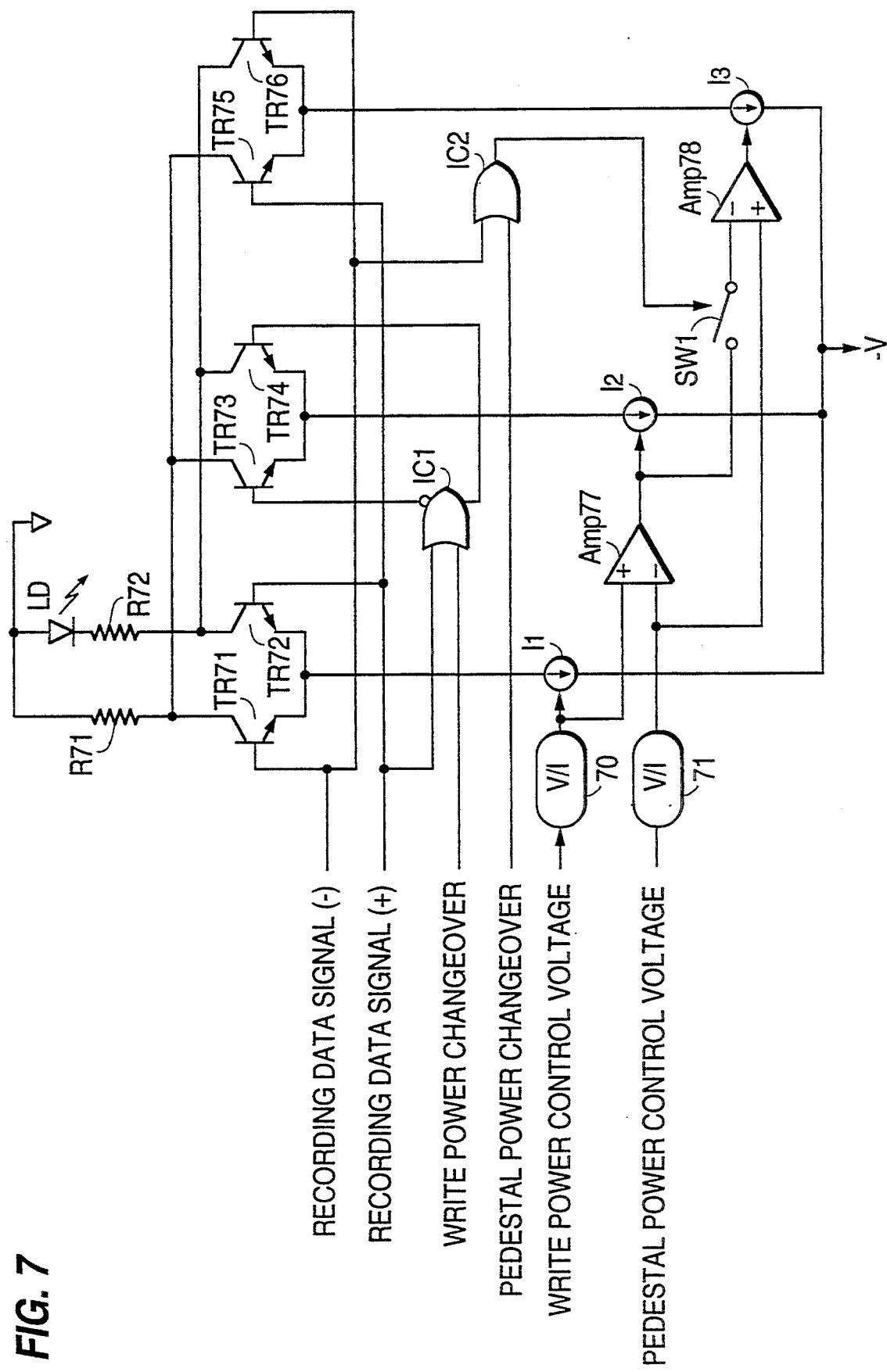
FIG. 7 is a circuit diagram showing a laser drive circuit according to a second embodiment of the present invention.

The laser power monitor circuit shown in FIG. 1 can use the laser drive circuit shown in FIG. 7.

FIG. 7 is a circuit diagram of a laser drive circuit according to a second embodiment of the present invention.

Figure 9:
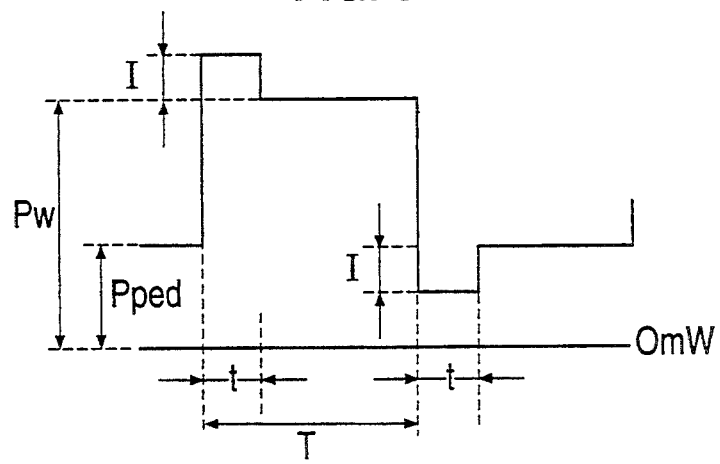
FIG. 9 is a diagram showing the light generation waveform of a laser using the laser drive circuit shown in FIG. 7.

This laser drive circuit drives the laser such that the laser generates light according to the waveform shown in FIG. 9.

In the case of forming a mark in a recording medium, the laser power level is set to the write power Pw, and is set to the pedestal power Pped between marks. The laser power Pw>Pped. The recording correction affects emphasis of the respective front edge and rear edge of the mark. In this case, the laser power level of the front edge is greater than the write power, and the laser power level of the rear edge is smaller than the pedestal power. The amounts of emphasis I of each edge are coequal, and the degree of emphasis is represented by the following equation.

$$\text{Edge degree of emphasis} = I/(Pw - Pped).$$

Moreover, taking the edge emphasis time as t, t is shorter than the light generation time at Pw or Pped. Taking the light generation time at the write power as T, t=T/4.

The laser drive circuit added to the recording correction circuit is constituted as follows.

The current source $I_1$ controls the laser power level for the write operation, and the current source $I_3$ controls the laser power level for the pedestal power. Then, $I_2$ is a laser drive current source corresponding to the respective emphasis amount I of the front edge and rear edge (See FIG. 9).

The degree of emphasis of the front edge and rear edge of the mark at the time of recording correction, with respective currents i1, i2, and i3 flowing in the current sources $I_1$, $I_2$ and $I_3$, is represented by the following equation.

Edge degree of emphasis=$i2/(i1-i3)$.

That is, the edge emphasis amount I when the laser power level changes from the pedestal power level to the write power level is controlled by the current source $I_2$. The edge emphasis amount I when the laser power level changes from the write power level to the pedestal power level is also controlled by the current source $I_2$.

Signals are output by Amp77, corresponding to the difference of the laser drive current appropriate for the write level and the laser drive current appropriate for the pedestal level. The laser drive current source $I_2$ is controlled by this difference signal. The emphasis amount I is controlled due to control of the laser drive current source $I_2$.

The control of the emphasis time t (see FIG. 9) is performed by inputs to the integrated circuits IC1 and IC2 which control the output timing of write power timing changeover signals and pedestal power signals. The operation of the laser drive circuit of FIG. 7 will be described next.

When the laser power level changes from the pedestal power to the write power, the recording data signal (−) (inverted recording signal) changes from a high level signal to a low level signal, and the recording data signal (+) (recording signal) changes from a low level signal to a high level signal. Then, TR72 goes ON, and a current i1 is caused to flow to the semiconductor laser LD by the current source $I_1$. Moreover, at the same time, the write power changeover signal also goes to a high level. Then, because, a high level signal is input to IC1, a signal which is also a high level signal is output from IC1 to TR74. Accordingly, TR74 goes ON, and a current i2 is caused to flow in LD by the current source $I_2$.

The write power changeover signal becomes a low power signal when the time exceeds T/4. Then, TR74 goes OFF, and the current flowing in LD becomes only i1. When the laser power level changes from the write power level to the pedestal power level, the recording data signal (+) changes from a high level signal to a low level signal, and the recording data signal (−) changes from a low level signal to a high level signal. Because of this, TR72 goes OFF, and TR76 goes ON. Due to TR76 going ON, a current i3 is caused by current source I3 to flow in LD. However, the pedestal power changeover signal also consists of a high level signal, and is input to IC2. Because of this, a high level signal is input to SW 1 from IC2. SW 1 is a switch which goes ON only when a high level signal has been output. The current flowing from the current source I3 is controlled by Amp78. At this time, a current (i3−i2) flows in the current source I3. A current (i3−i2) then flows in LD. Furthermore, when time T/4 is exceeded, the pedestal power changeover signal changes from a high level signal to a low level signal, and SW1 goes OFF. Accordingly, a current i3 flows in LD.

Moreover, in the case of forming a mark in a recording medium, control to set the laser power at the write power is performed by a write power control voltage as a predetermined voltage value. The control to set the laser power at the, pedestal power between marks is performed by a pedestal power control voltage as a second predetermined voltage value. The semiconductor laser LD is driven with a current and timing corresponding to the write power control voltage or pedestal power control voltage which has been set.

This kind of control of laser power uses a laser power control circuit as shown in FIG. 2.

Figure 10:
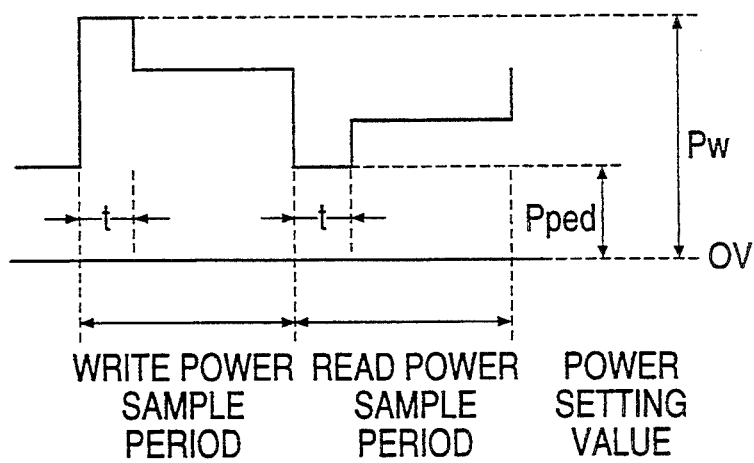
FIG. 10 is a diagram showing the laser light generation waveform when laser power correction is performed at the time of recording correction using the laser drive circuit as shown in FIG. 7.

By employing the above-noted control of laser power, in the case that difference detection is performed between the emphasis times t shown in FIG. 9, the laser light generation waveform becomes as shown in FIG. 10. The write power, in comparison with a set value Pw, which generates an amount of light, is smaller by just the recording correction amount, and the pedestal power, in comparison with a set value Pped, which generates a second amount of light, is greater by just the recording correction amount. In this manner, accurate control of the laser power is not possible. As a result, accurate setting of the respective overshoot and undershoot amounts of the front and rear edge of the mark is not performed, and it becomes impossible to correctly set the recording correction amount. Therefore, it is preferable to perform difference detection of the pedestal power and write power in and after the emphasis time t.

Consequently, the laser power monitor circuit shown in FIG. 1 is used. By using this kind of laser power monitor circuit, as shown by the thick lines in FIG. 11, it is possible to monitor a flat waveform of laser power.

Figure 11:
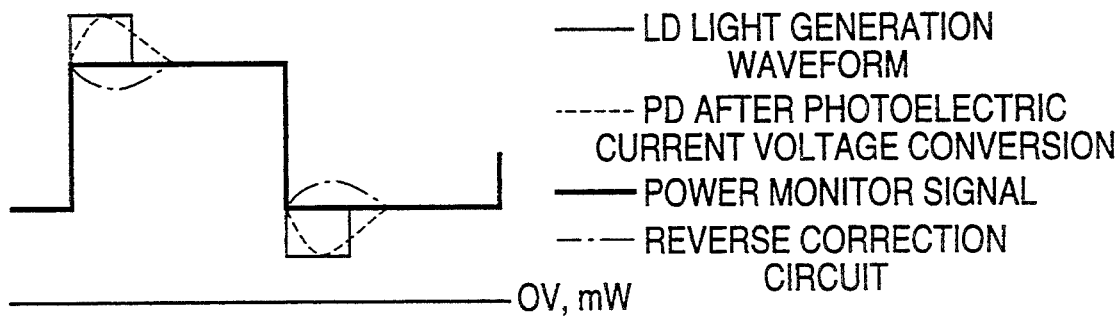
FIG. 11 is a waveform diagram showing laser power through a laser power monitor circuit according to a fourth embodiment of the present invention using the laser power monitor of FIG. 1 and the laser drive circuit of FIG. 7.

The portion represented by the full line in FIG. 11 shows the light generation waveform of the laser during the recording correction time. When the waveform is input into a laser power monitor circuit with an added reverse correction circuit, the characteristic represented by the single dot chain lines is added. The output waveform obtained as a result becomes the waveform represented by the thick line of FIG. 11.

In FIG. 1, when the laser light is input into the PIN photodiode PD, current is generated by the PIN photodiode PD proportional to the amount of emitted laser light. This current is converted from current to voltage by AMP1. Due to the bandwidth limits of the circuit (including the PD), the waveform of the output signal from AMP1 becomes a waveform shown by the broken lines in FIG. 11. Next, the waveform of the output signal from AMP1, corrected in the added reverse correction circuit AMP2 to the voltage waveform shown by the thick line of FIG. 11, is output as a power monitor signal.

The frequency characteristic of the reverse correction circuit shown in FIG. 1 and the frequency characteristic of the above-noted current to voltage conversion circuit (including PD) may be about equal to the combined characteristic. In the present embodiment, the frequency characteristic of the reverse correction circuit is set by the constants in the following equations.

$f1b = 1/R4 \times C1$, $f2b = (R3+R4)/(R3 \times R4) \times C1$.

Then, a frequency characteristic of the reverse correction such as the waveform of the dotted lines in FIG. 11 is obtained.

Figure 8:
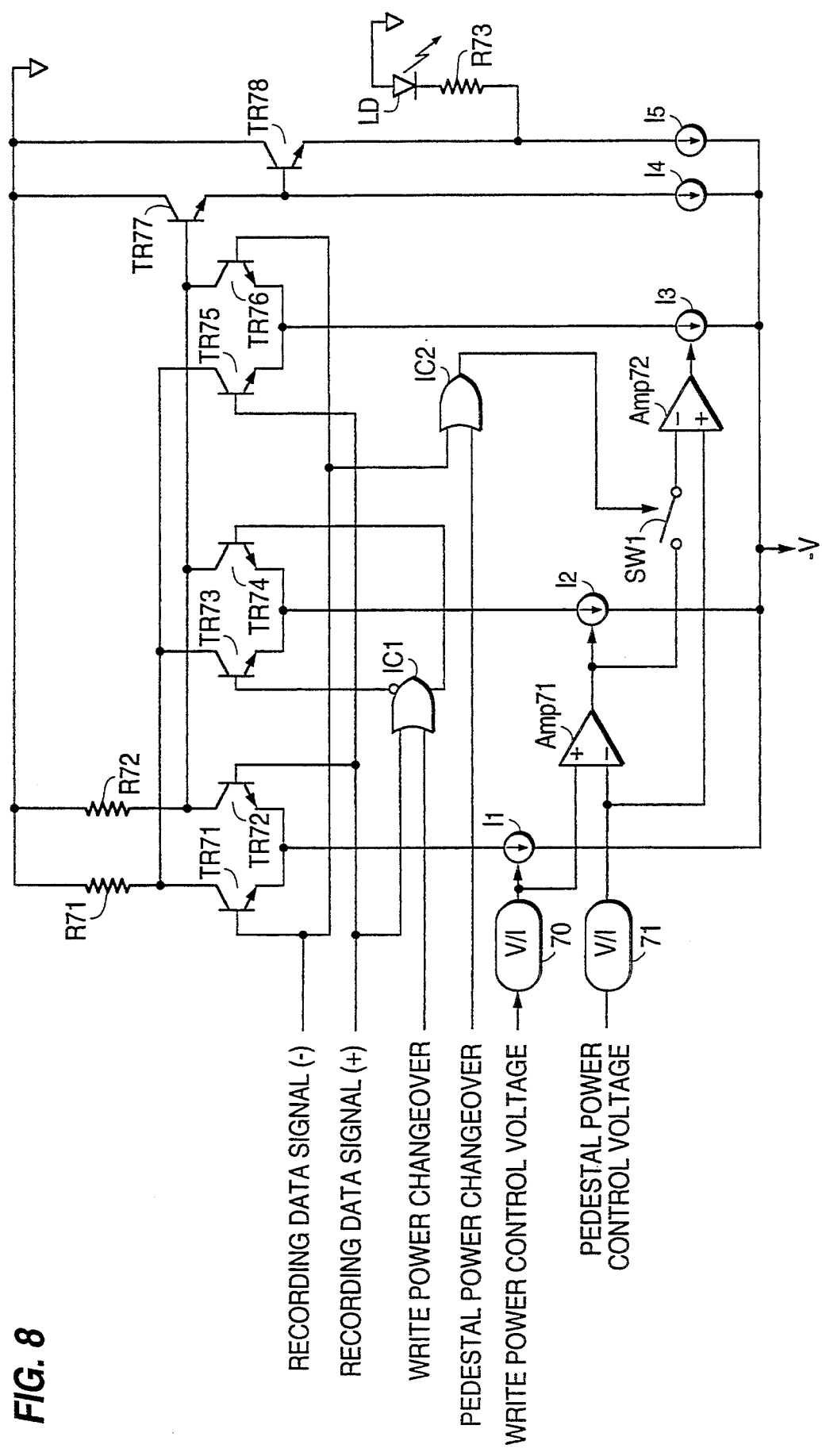
FIG. 8 is a circuit diagram showing a laser drive circuit according to a third embodiment of the present invention.

Further, the laser drive circuit of FIG. 8 may also be substituted for the laser drive circuit of FIG. 7, and using a laser power monitor circuit similar to that shown in FIG. 1, laser power can be accurately monitored. Because of this, even in a digital laser waveform, by using the bandwidth limits of the PD and the current to voltage conversion circuit, it is possible to secure reverse correction.

Figure 12:
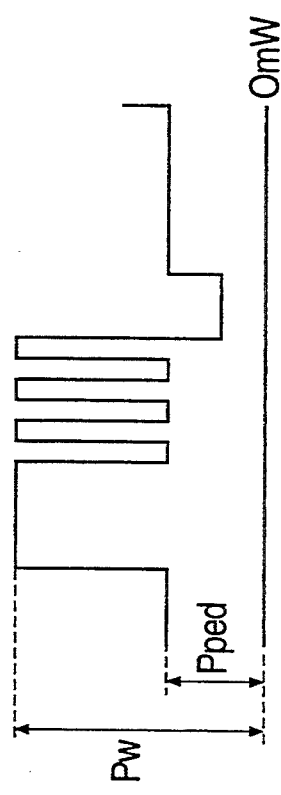
FIG. 12 is a diagram showing the light generation waveform of a laser using the laser drive circuit of FIG. 8.
Figure 13:
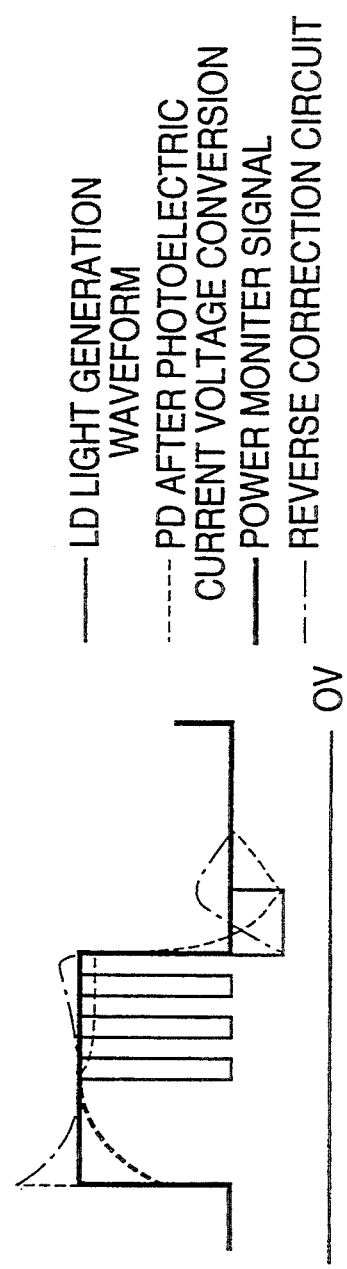
FIG. 13 is a waveform diagram showing laser power through a laser power monitor circuit using the laser drive circuit of FIG. 8.
Figure 14:
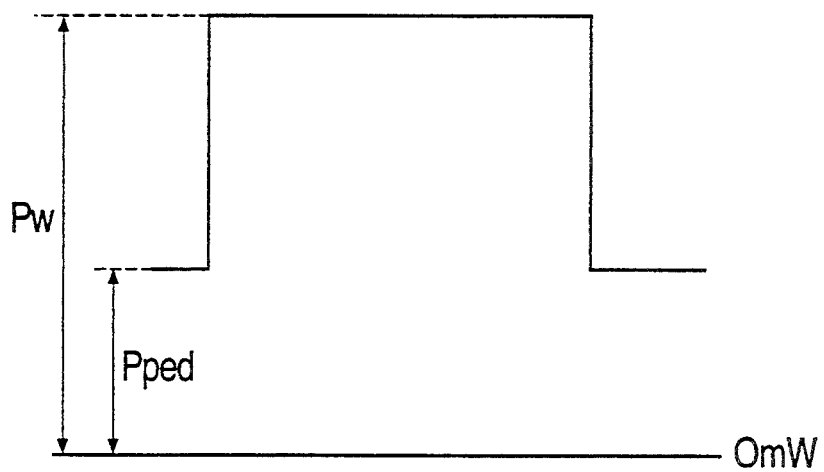
FIG. 14 is a diagram showing the light generation waveform of a conventional laser.
Figure 15:
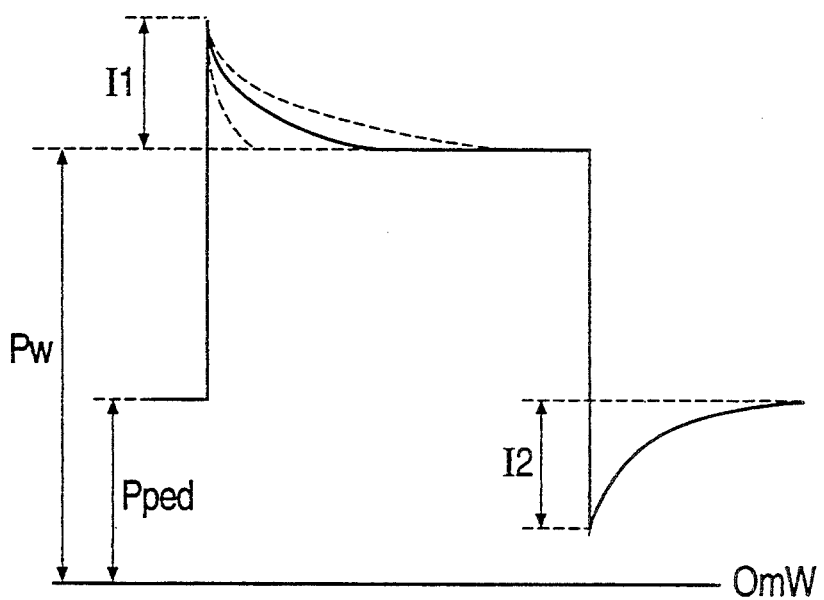
FIG. 15 is a diagram showing the light generation waveform of a conventional laser with recording correction performed.

Moreover, in the case of performing recording correction by the laser light generation waveform shown in FIG. 12, and by shaping the waveform of the laser power monitor as shown in FIG. 13, it is similarly possible to perform accurate control of the laser.

Moreover, it is possible to perform reverse correction by combining the waveform characteristics, using other laser drive circuits in a similar manner, and it is possible to accurately monitor the laser power.

In the above manner, by using the laser power monitor circuit, shaping of the laser power monitor waveform is possible in the reverse correction circuit. Because of this, the pedestal power level and the write power level can be detected regardless of the recording correction amount. Due to this, a recording correction operation is possible without reducing the laser power control accuracy during recording.

Moreover, by using the laser power monitor circuit, the detection of the pedestal power level and the write power level is accurately performed regardless of the recording correction amount. Accordingly, the timing detected in the control circuit becomes good even if, for example, the time precision of the sample and hold timing is poor. The effect of this is that the circuit becomes inexpensive.

Although a few preferred embodiments of the present invention have been shown or described, it would be appreciated by those skilled in the that changes may be made in these embodiments without departing from the principles and spirit of the invention, the scope of which is defined in the claims and their equivalents.

What is claimed is:

1. A circuit for monitoring power of light emitted from a laser, said circuit comprising:
    a monitor unit to monitor the power of the light and, as a result, generating a monitor signal;
    a setting circuit to set the power of the light at distinct predetermined levels;
    a correction circuit to correct and adjust the power of the light relative to the distinct predetermined levels; and
    a reverse correction circuit to reverse correct the correction made by the correction circuit based upon the monitor signal.

2. The circuit as claimed in claim 1, wherein said correction and reverse correction circuits have respective frequency characteristics which are substantially equal to each other.

3. A circuit for monitoring power of light emitted from a laser, said circuit comprising:
    a photoelectric conversion unit to convert the power of the laser into an electrical signal proportional to the power;
    a setting circuit to set the power of the light at distinct predetermined levels;
    a correction circuit to correct and adjust the power of the light relative to the distinct predetermined levels; and
    a reverse correction circuit to reverse correct the correction made by the correction circuit based upon the electrical signal output by said photoelectric conversion unit.

4. The circuit as claimed in claim 3, wherein said setting circuit comprises a current to voltage conversion circuit to convert the electrical signal from said photoelectric conversion unit to corresponding voltages.

5. The circuit as claimed in 4, wherein said correction and reverse correction circuits have respective frequency characteristics which are substantially equal to each other.

6. The circuit as claimed in claim 3, wherein said correction and reverse correction circuits have respective frequency characteristics which are substantially equal to each other.

7. A circuit for monitoring power of a laser used to make a mark in an optical disk, said circuit comprising:
    a laser drive circuit to drive the laser to produce a write power level which forms the mark and a pedestal power level which does not form the mark, and to drive the laser to produce an overshoot correction of the write power level at a front edge of the mark and an undershoot correction of the pedestal power level at a back edge of the mark;
    a laser control circuit, connected to said laser drive circuit, to control said laser drive circuit; and
    a laser monitor circuit, connected to the laser control circuit, to monitor the power of the laser and to provide a reverse overshoot correction of the write power and reverse undershoot correction of the pedestal power through said laser control and laser drive circuits.

8. The circuit as claimed in claim 7, wherein said laser monitor circuit comprises:
    a photoelectric conversion unit to convert the power of the laser to an electrical signal proportional to the power;
    a current to voltage converter to convert the electrical signal to a voltage; and
    a reverse correction circuit to generate a power monitor signal in dependence upon the voltage, and to supply the power monitor signal to said laser control circuit, thereby providing the reverse overshoot correction and the reverse undershoot correction.

9. The circuit as claimed in claim 8, wherein each of said current to voltage converter and said reverse correction circuits comprise an operational amplifier.

10. The circuit as claimed in claim 8, wherein said laser control circuit comprises:
    a difference circuit to determine a voltage difference between the power monitor signal and one of a write power setting voltage and a pedestal power setting voltage, to generate a difference signal;
    a sample and hold circuit to sample and hold the difference signal using a predetermined power sample timing signal; and
    a loop filter circuit to receive said held difference signal and, in response, generating and supplying a corresponding one of a write power control voltage and a pedestal power control voltage to said laser drive circuit.

11. The circuit as claimed in claim 10, wherein said laser drive circuit comprises:
    an inductor and first resistor connected in parallel with respective first ends connected to each other and respective second ends connected to each other, said first ends receiving the pedestal power control voltage from said loop filter circuit;
    a second resistor having a first end connected to the second ends of said inductor and first resistor, and a second end;
    a transistor having a collector connected to said second end of said second resistor and an emitter; and a constant current source controlled by the write power control voltage from said loop filter circuit and connected to the emitter of the first transistor;

wherein a node at the collector of the transistor has a potential proportional to a driving potential of the laser.

12. The circuit as claimed in claim 10, wherein said laser drive circuit comprises:

a voltage to current converter to convert the write power control voltage and pedestal power control voltage to corresponding currents;

a second difference circuit to determine a difference between the two corresponding currents, to generate a first current signal;

a switch to alternately enable transmission of the first current signal in dependence upon a pedestal power changeover signal;

a third difference circuit connected to said switch and the voltage to current converter to determine a difference between the first current signal and the current corresponding to the pedestal power control voltage, to generate a second current signal; and a first constant current source controlled by the current corresponding to the write power control voltage, a second constant current source controlled by the first current signal, and a third constant current source controlled by the second current signal, said first through third constant current sources controlling a total amount of current supplied to the laser.

* * * * *

UNITED STATES PATENT AND TRADEMARK OFFICE
CERTIFICATE OF CORRECTION

PATENT NO. : 5,438,582
DATED : August 1, 1995
INVENTOR(S) : Shunji HOSHINO, et al.

It is certified that error appears in the above-indentified patent and that said Letters Patent is hereby corrected as shown below:

Column 12, line 1, "4" should be --3--;

Column 12, line 5, "3" should be --4--

Signed and Sealed this

Twenty-seventh Day of February, 1996

Attest:

BRUCE LEHMAN

*Attesting Officer*     *Commissioner of Patents and Trademarks*